US012658815B2

(12) United States Patent
Mima et al.

(10) Patent No.: US 12,658,815 B2
(45) Date of Patent: Jun. 16, 2026

(54) POWER CONVERSION APPARATUS

(71) Applicant: Hitachi Astemo, Ltd., Hitachinaka (JP)

(72) Inventors: Akira Mima, Tokyo (JP); Takeshi Tokuyama, Tokyo (JP); Junpei Kusukawa, Tokyo (JP); Takashi Hirao, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 342 days.

(21) Appl. No.: 18/271,497

(22) PCT Filed: Sep. 30, 2021

(86) PCT No.: PCT/JP2021/036311
§ 371 (c)(1),
(2) Date: Jul. 10, 2023

(87) PCT Pub. No.: WO2022/153620
PCT Pub. Date: Jul. 21, 2022

(65) Prior Publication Data

US 2024/0136936 A1 Apr. 25, 2024
US 2024/0235410 A9 Jul. 11, 2024

(30) Foreign Application Priority Data

Jan. 13, 2021 (JP) ................................. 2021-003827

(51) Int. Cl.
*H02M 7/00* (2006.01)
*H02M 7/48* (2007.01)
*H05K 7/20* (2006.01)

(52) U.S. Cl.
CPC ............. *H02M 7/003* (2013.01); *H02M 7/48* (2013.01); *H05K 7/2039* (2013.01)

(58) Field of Classification Search
CPC ..... H02M 7/003; H02M 7/5387; Y02E 60/10; Y02E 60/13; H01M 10/0585; H01M 50/103
See application file for complete search history.

(56) References Cited

U.S. PATENT DOCUMENTS

| | | |
|---|---|---|
| 2014/0118909 A1 | 5/2014 | Matsuno et al. |
| 2016/0128216 A1 | 5/2016 | Harada et al. |
| 2020/0251282 A1 | 8/2020 | Tomita et al. |

FOREIGN PATENT DOCUMENTS

| | | |
|---|---|---|
| JP | 11-98815 A | 4/1999 |
| JP | 2000-152662 A | 5/2000 |

(Continued)

OTHER PUBLICATIONS

JP 2019180113 A Tranlation (Year: 2019).*

(Continued)

*Primary Examiner* — Bryan R Perez
(74) *Attorney, Agent, or Firm* — Crowell & Moring LLP

(57) ABSTRACT

Provided are a positive electrode terminal and a negative electrode terminal being terminals of a capacitor element; a positive electrode conductor plate connected to the positive electrode terminal; a negative electrode conductor plate connected to the negative electrode terminal; and a power conversion module connected to the two conductor plates. The positive electrode terminal and the negative electrode terminal are formed along an arrangement direction of the capacitor element. The positive electrode conductor plate and the negative electrode conductor plate form a laminated conductor portion in which the positive electrode conductor plate and the negative electrode conductor plate have respective main surfaces disposed, to face the main surface of the capacitor element, and are laminated to each other. The laminated conductor portion has a first laminated region laminated to face a main surface of the negative electrode (Continued)

terminal and a second laminated region laminated to face a main surface of the positive electrode terminal.

15 Claims, 8 Drawing Sheets

(56)                    References Cited

FOREIGN PATENT DOCUMENTS

| JP | 2005-130542 A | 5/2005 | |
| JP | 2005-159106 A | 6/2005 | |
| JP | 2006-19367 A | 1/2006 | |
| JP | 2014-90538 A | 5/2014 | |
| JP | 2016-93090 A | 5/2016 | |
| JP | 2019180113 A * | 10/2019 | ........... H02M 7/003 |
| WO | WO 2019/107128 A1 | 6/2019 | |

OTHER PUBLICATIONS

International Search Report (PCT/ISA/210) issued in PCT Application No. PCT/JP2021/036311 dated Nov. 9, 2021 with English translation (4 pages).
Japanese-language Written Opinion (PCT/ISA/237) issued in PCT Application No. PCT/JP2021/036311 dated Nov. 9, 2021 (3 pages).
English translation of Japanese-language Office Action issued in Japanese Application No. 2021-003827 dated Jul. 2, 2024 (5 pages).
Japanese-language Office Action issued in Japanese Application No. 2021-003827 dated Nov. 5, 2024 with English translation (10 pages).

* cited by examiner

Self Inductance

POWER CONVERSION APPARATUS

TECHNICAL FIELD

The present invention relates to a power conversion apparatus.

BACKGROUND ART

In recent years, high power density of power conversion apparatuses has been required, and miniaturization and weight reduction thereof have been advanced. In particular, in an electric vehicle or a hybrid vehicle mounted with a battery, there is a strong request for miniaturization in order to reduce the weight of the vehicle body and secure the vehicle interior space, and in addition to this, a power conversion apparatus with a low inductance is required.

As a background art of the present invention, PTL 1 below discloses a technique in which since a multilayer capacitor element in which first and second plate-shaped terminals having an L shape and having a width substantially equal to the width of a metallikon electrode are connected to metallikon electrodes at both ends of a capacitor is disposed on one surface side of a base body, currents in opposite directions flow to cancel a magnetic field due to the currents, thereby reducing inductance of a wiring electrode.

CITATION LIST

Patent Literature

PTL 1: JP 2005-159106 A

SUMMARY OF INVENTION

Technical Problem

As the miniaturization of the power conversion apparatus progresses, the installation space of the DC electric wiring that connects the capacitor and the power module is limited. Therefore, in order to achieve both densification and inductance reduction, the technique described in PTL 1 is insufficient to handle this issue.

In view of the above, an object of the present invention is to provide a power conversion apparatus that achieves both miniaturization and low inductance.

Solution to Problem

A power conversion apparatus of the present invention includes: a positive electrode terminal and a negative electrode terminal being terminals of a capacitor element; a positive electrode conductor plate connected to the positive electrode terminal; a negative electrode conductor plate connected to the negative electrode terminal; and a power conversion module connected to the positive electrode conductor plate and the negative electrode conductor plate, the power conversion module configured to exchange DC power and AC power for each other. The positive electrode terminal and the negative electrode terminal are formed along an arrangement direction of the capacitor element. The positive electrode conductor plate and the negative electrode conductor plate form a laminated conductor portion in which the positive electrode conductor plate and the negative electrode conductor plate have respective main surfaces disposed, to face the main surface of the capacitor element, and are laminated to each other. The laminated conductor portion has a first laminated region laminated to face a main surface of the negative electrode terminal and a second laminated region laminated to face a main surface of the positive electrode terminal.

Advantageous Effects of Invention

According to the present invention, it is possible to provide a power conversion apparatus that achieves both miniaturization and low inductance.

DESCRIPTION OF EMBODIMENTS

Figure 1:
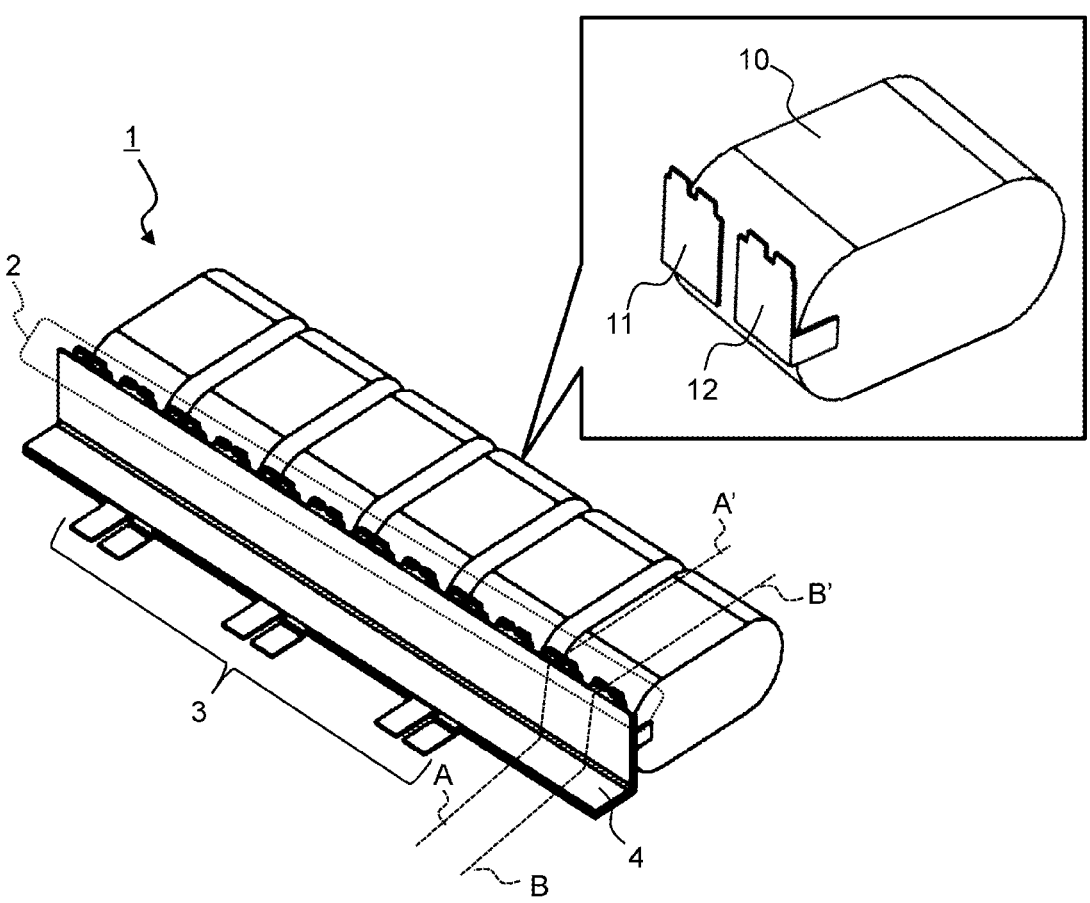
FIG. 1 is a schematic diagram of a wiring structure of a power conversion apparatus according to an embodiment of the present invention.

Hereinafter, embodiments of the present invention will be described with reference to the drawings. The following description and drawings are exemplary for describing the present invention, and are omitted and simplified as appropriate for the sake of clarity of description. The present invention can be implemented also in various other forms. Unless otherwise specified, each component may be singular or plural.

The position, size, shape, range, and the like of each component shown in the drawings may not represent an actual position, size, shape, range, and the like in order to facilitate understanding of the invention. Therefore, the present invention is not necessarily limited to the position, size, shape, range, and the like disclosed in the drawings.

Problems of Conventional Technique

First, problems of the conventional technique will be described. In the conventional technique, as described above, since the installation space of the DC electric wiring connecting the capacitor and the power module is limited, it is difficult to meet the demand for miniaturization. In addition, since a penetrating portion is provided in the bus bar for connection of the capacitor terminal, and the penetrating portion is connected to the bus bar on the opposite side of the capacitor through the positive electrode terminal or the negative electrode terminal of the capacitor, the facing area (lamination area, wiring area of DC electric wiring) between the positive electrode DC wiring portion and the negative electrode DC wiring portion (DC wiring portion connecting the power module and the capacitor terminal)

having a laminated structure is reduced. As the miniaturization progresses, there is a problem that the facing area is further reduced.

Still furthermore, when the wiring line is connected to the penetrating portion of the bus bar, insulation treatment needs to be applied, but this structure complicates the insulation treatment. In addition to this, there has been a problem that the connection step between the capacitor and the bus bar is also complicated. Based on this, the present invention solves the problem by laminating the capacitor lead terminal and the positive electrode negative electrode bus bar to connect them at the end portion.

An Embodiment of Present Invention and Configuration Thereof

FIG. 1 is a schematic diagram of a wiring structure of a power conversion apparatus according to an embodiment of the present invention.

As the wiring structure 1 of the power conversion apparatus, FIG. 1 shows a capacitor element 10 that smooths a voltage supplied from a power supply, a negative electrode terminal 11 and a positive electrode terminal 12 of the capacitor element 10, a bus bar portion 4, an end portion 2 (hereinafter, the end portion 2) of the bus bar portion formed on a side where a capacitor is installed, and an end portion 3 (hereinafter, the end portion 3) of the bus bar portion formed on a side where a power conversion module 20 (see FIG. 4) is installed.

The capacitor elements 10 are arranged in a line by disposing each side surface which has an elliptic shape and to which neither a negative electrode terminal 11 nor a positive electrode terminal 12 is attached adjacent to each other. In addition, in each capacitor element 10, each of the negative electrode terminal 11 and the positive electrode terminal 12 is formed along the arrangement direction of the capacitor elements 10. Therefore, along with this, the negative electrode terminal 11 and the positive electrode terminal 12 are also arranged adjacent to each other in a line.

The bus bar portion 4 is provided at a position facing the negative electrode terminal 11 and the positive electrode terminal 12 arranged in a line, and the bus bar portion 4 is connected to the negative electrode terminal 11 and the positive electrode terminal 12 at an end portion 2. With respect to this connection, it is necessary to apply insulation treatment, but since insulation treatment using an insulation cap is possible, the insulation treatment can be facilitated.

The bus bar portion 4 is provided with an end portion 3 for connecting to the power conversion module 20 on a side opposite to the side where the end portion 2 is provided. Accordingly, a voltage smoothed by the capacitor element 10 is sent to the power conversion module 20. The power conversion module 20 has a function of mutually converting DC power and AC power, converts DC power input through the bus bar portion 4 into AC power, and converts AC power into DC power to output the DC power to the bus bar portion 4.

Figure 2:
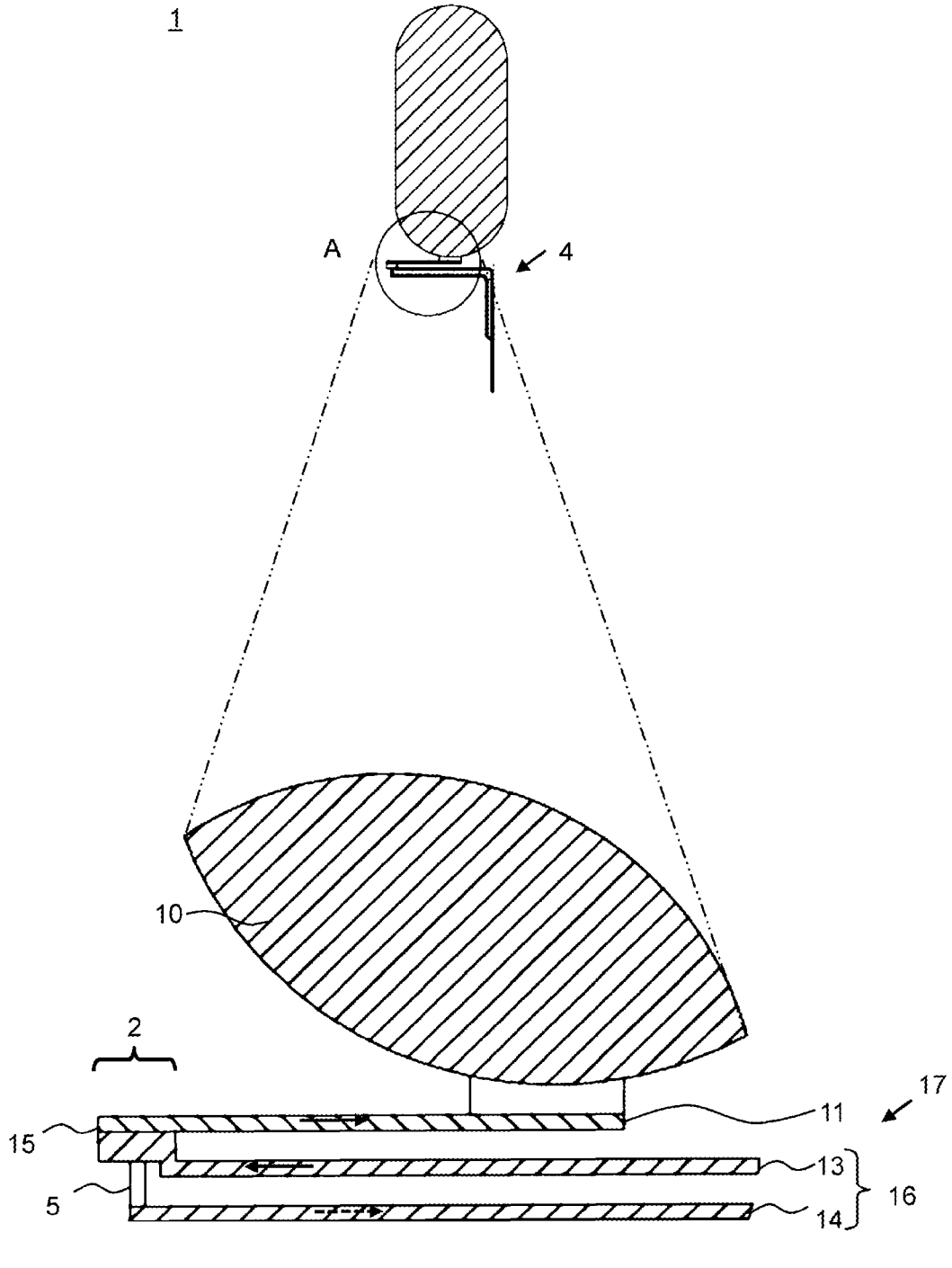
FIG. 2 is a cross-sectional view taken along line A-A' in FIG. 1.

FIG. 2 is a cross-sectional view taken along line A-A' in FIG. 1.

In the enlarged portion A of the wiring structure 1 of the power conversion apparatus, details of the bus bar portion 4 connected to the capacitor element 10 are shown. The negative electrode terminal 11 of the capacitor element 10 is connected to the negative electrode conductor plate 13 at the end portion 2 at a connecting portion 15 of the end portion at the end portion 2. The positive electrode conductor plate 14 is provided so as to be side by side with the negative electrode conductor plate 13 through the insulation cap 5. The negative electrode conductor plate 13 and the positive electrode conductor plate 14 form a laminated conductor portion 16 in which they have respective main surfaces disposed, to face the main surface of the capacitor element 10, and are laminated to each other.

In FIG. 2, the laminated conductor portion 16 has a first laminated region 17 to be laminated to face the main surface of the negative electrode terminal 11. The negative electrode terminal 11 and the laminated conductor portion 16 are laminated (arranged in parallel). Conventionally, in the connection with the capacitor element, a penetrating portion has been required for the bus bar portion (laminated conductor portion 16), but since this configuration of the present invention does not need a penetrating portion, insulation treatment and a step of connecting the capacitor and the bus bar can be facilitated.

In addition, since the current is folded back at the connecting portion 15 and flows to the negative electrode terminal 11, the direction of the current flowing to the negative electrode terminal 11 and the direction of the current flowing to the negative electrode conductor plate 13 are reversed. Therefore, there is an effect that the parasitic inductance of the wiring at the first laminated region 17 can be reduced by canceling the mutual magnetic fields generated by the currents.

It should be noted that FIG. 2 shows a state of a mirror current in which the current flowing through the positive electrode conductor plate 14 is reverse to the current flowing through the negative electrode conductor plate 13. This mirror current also cancels the magnetic field generated by the current flowing through the positive electrode conductor plate 14, and the parasitic inductance of the wiring at the laminated conductor portion 16 can be reduced. Furthermore, since the wiring of capacitor element 10 and the DC conductor plate (negative electrode conductor plate 13 or positive electrode conductor plate 14) are disposed to face each other to form a laminated structure, parasitic inductance between the DC conductor plate and the capacitor element terminal can be reduced.

Figure 3:
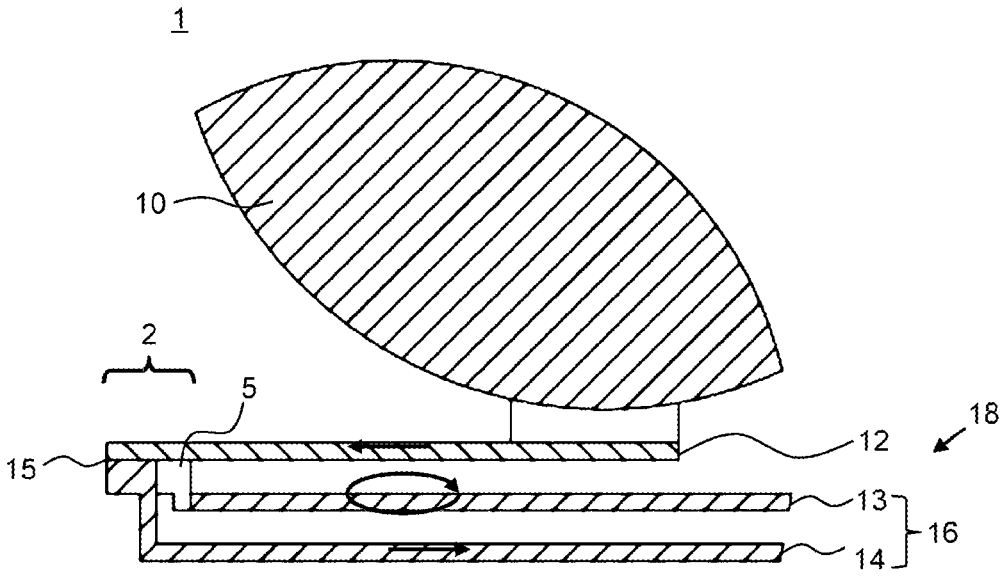
FIG. 3 is a cross-sectional view taken along line B-B' in FIG. 1.

FIG. 3 is a cross-sectional view taken along line B-B' in FIG. 1.

Similarly to FIG. 2, FIG. 3 shows details of the bus bar portion 4 connected to the capacitor element 10, but differs from FIG. 2 in that the terminal of the capacitor element 10 is the positive electrode terminal 12. The laminated conductor portion 16 has a second laminated region 18 to be laminated to face the main surface of the positive electrode terminal 12. In addition, although the positive electrode terminal 12 is connected to the positive electrode conductor plate 14, the laminated conductor portion 16 is provided with a negative electrode conductor plate 13 through the insulation cap 5 so as to be side by side with the positive electrode conductor plate 14.

In addition, since the current is folded back at the connecting portion 15 and flows to the positive electrode terminal 12, the direction of the current flowing to the positive electrode terminal 12 and the direction of the current flowing to the positive electrode conductor plate 14 are reversed. Therefore, the inductance is reduced by canceling the mutual magnetic fields generated by the currents. It should be noted that in the vicinity of the second laminated region 18, since the magnetic field is cancelled by the mutually opposite currents flowing through the positive electrode terminal 12 and the positive electrode conductor plate 14, no current flows through the negative electrode conductor plate 13.

In common with FIGS. 2 and 3, the laminated conductor portion 16 is connected to the negative electrode terminal 11 and the positive electrode terminal 12 at the end portion 2 of the laminated conductor portion 16. That is, unlike the conventional technique, there is no need to connect one of the negative electrode terminal 11 and the positive electrode terminal 12 to one of the laminated negative electrode conductor plate 13 and positive electrode conductor plate 14 on the opposite side of the capacitor element 10. Therefore, the laminated conductor portion 16 does not have a through hole for passing the negative electrode terminal 11 or the positive electrode terminal 12. With this connection form, it is possible to effectively use the facing surfaces of the positive electrode conductor plate 14 and the negative electrode conductor plate 13.

In addition, as described above, since the bus bar portion 4 (laminated conductor portion 16, DC conductor plates 13 and 14) does not have a through hole, there is no need to pass the connection terminal through the through hole. Therefore, there is no need to apply a complicated insulation treatment caused by the presence of the connection terminal to be passed through the through hole. At the end portion 2 of the laminated conductor portion 16, it is possible to easily perform insulation treatment so as to cover the exposed portion of the terminal.

Figure 4:
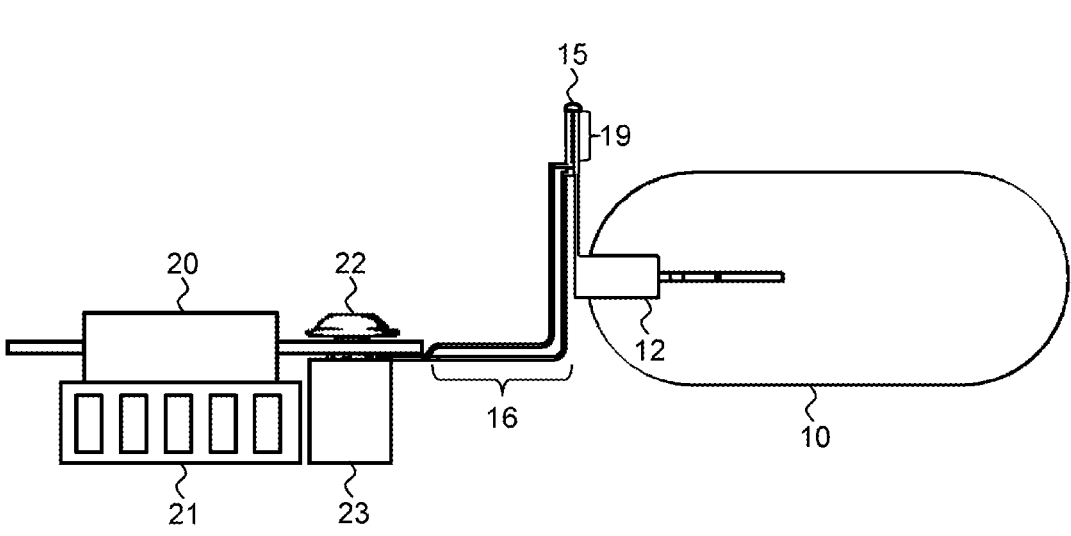
FIG. 4 is a structural schematic diagram of a power conversion apparatus according to an embodiment of the present invention.

FIG. 4 is a structural schematic diagram of a power conversion apparatus according to an embodiment of the present invention.

As shown in FIG. 4, the power conversion apparatus includes a capacitor element 10, a negative electrode terminal 11 (not shown), a positive electrode terminal 12, a laminated conductor portion 16, a power conversion module 20, a cooling fin 21 for cooling the power conversion module 20, a screw 22 for connecting and fixing the power conversion module 20 and the laminated conductor portion 16, and a terminal block 23 for fixing the screw 22. The positive electrode terminal 12 and the laminated conductor portion 16 are connected at the connecting portion 15 of the end portion.

In the connecting portion 15, in order to perform tungsten inert gas (TIG) welding, an exposed core 19 for TIG welding is provided. In the exposed core 19, an end portion of any one of the positive electrode conductor plate 14 and the negative electrode conductor plate 13 constituting the laminated conductor portion 16 and any one of the negative electrode terminal 11 and the positive electrode terminal 12 of the capacitor element 10 are bonded from both sides to form a shape in which palms of hands are pressed against each other.

In the TIG welding, a portion of the exposed core 19 is sandwiched between welding electrodes from both sides, and welding is performed at the connecting portion 15. It should be noted that the length of the exposed core 19 is suitably provided to be 8 mm or more. The power conversion module 20 and the laminated conductor portion 16 are connected by screwing a screw 22 onto the terminal block 23.

The power conversion module 20 generates heat due to a power loss generated at the time of power conversion, and thus is cooled by the cooling fin 21. Accordingly, the power conversion module 20 prevents breakdown due to temperature rise caused by heat generation.

Figure 5:
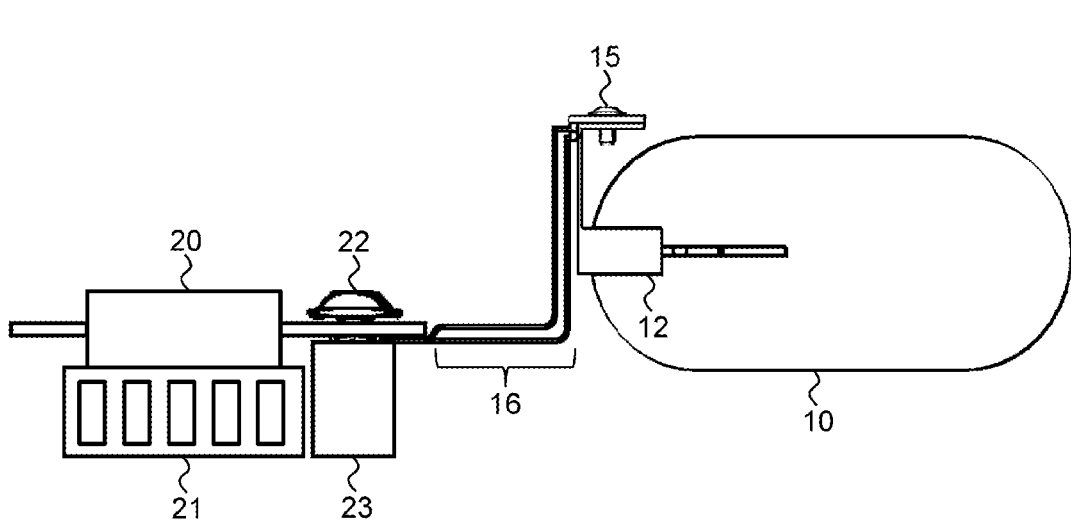
FIG. 5 is a modification of the connecting portion in FIG. 4.

FIG. 5 is a modification of the connecting portion in FIG. 4.

The difference from FIG. 4 is that the connection method between the laminated conductor portion 16 and the terminal portion (positive electrode terminal 12, negative electrode terminal 11) of the capacitor element 10 is different. In FIG. 4, the connection is performed by TIG welding method, but in FIG. 5, the connection is performed by screwing method. Accordingly, the connection between the laminated conductor portion 16 and the power conversion module 20 and the connection at the connecting portion 15 between the laminated conductor portion 16 and the terminal portion (positive electrode terminal 12, negative electrode terminal 11) of the capacitor element 10 can be unified, and thus the production step can be simplified.

In addition, the TIG welding method in FIG. 4 needs an exposed core 19 for sandwiching the terminal from both sides, and needs the connecting portion 15 to be joined to protrude above from the capacitor element 10. However, since there is no exposed core 19 in FIG. 5, the connecting portion 15 can be disposed immediately above the capacitor element 10, and can be made lower in height than that in FIG. 4 in the height direction (vertical direction in FIG. 5).

It should be noted that the TIG welding method in FIG. 4 requiring an external welding apparatus is a method of welding the side surface end portion of the terminal, and a laser welding method requiring an external welding apparatus similar to that in FIG. 5 can also be adopted. Accordingly, the facing surfaces of the terminals can be welded and may be connected by a method that does not need screwing.

Figures 6A, 6B:
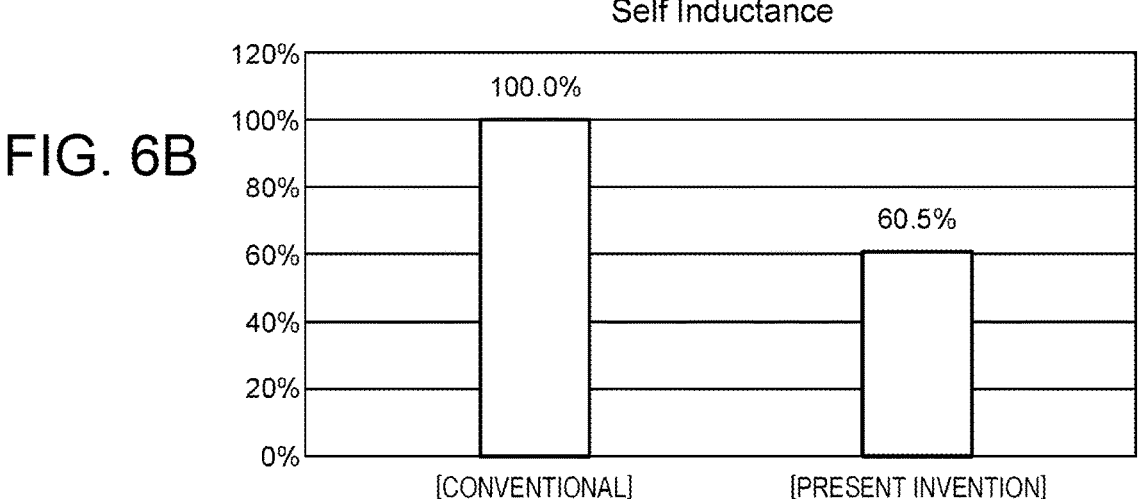
FIGS. 6A and 6B are conceptual diagrams showing a difference in effect between the conventional technique and the present invention.

FIGS. 6A and 6B are conceptual diagrams showing a difference in effect between the conventional technique and the present invention.

FIG. 6A shows a wiring structure 1A of a power conversion apparatus being a conventional technique, which is a wiring structure in which the negative electrode terminal 11 of the capacitor element 10 and the laminated conductor portion 16 do not face each other. This wiring structure does not have a laminated structure, and the effect of canceling the magnetic field, as in the present invention, generated by the mutual currents by the mirror current between the negative electrode terminal 11 of the capacitor element 10 and the laminated conductor portion 16 is small, and the wiring parasitic inductance cannot be reduced.

On the other hand, according to an embodiment of the present invention, as described above, the laminated conductor portion 16 and the negative electrode terminal 11 of the capacitor element 10 are caused to face each other to form a laminated structure, whereby the wiring parasitic inductance can be reduced.

FIG. 6B is a diagram showing the difference in the reduction effect of the wiring inductance, and it can be seen that the self-inductance of the wiring can be reduced by about 40% in the present invention when the wiring inductance by the wiring structure of the power conversion apparatus of the conventional technique is set to 100%.

Figure 7:
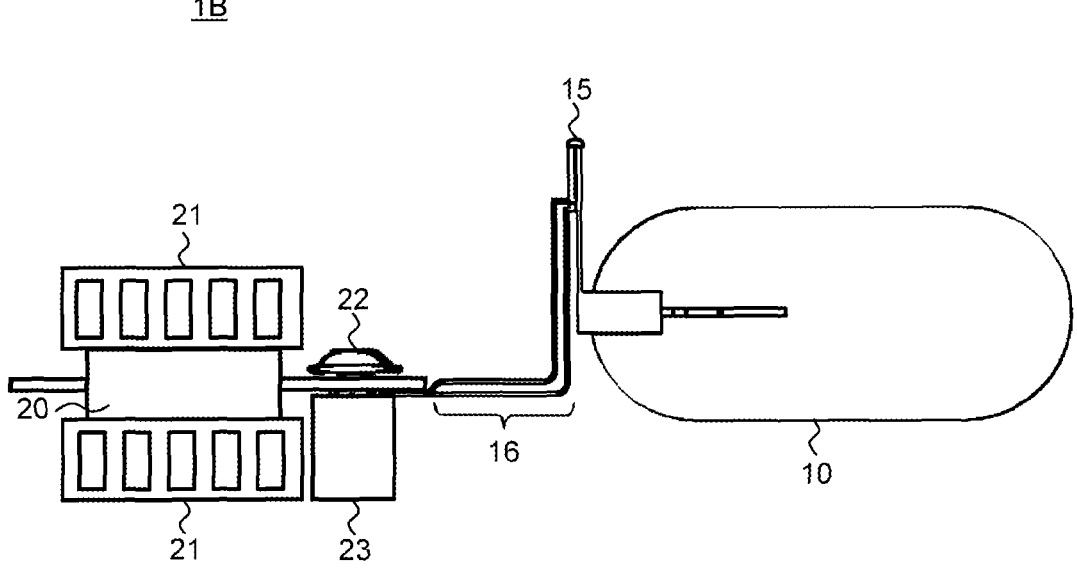
FIG. 7 is a structural schematic diagram of a power conversion apparatus using a double-sided cooling structure for a structure in FIG. 4.

FIG. 7 is a structural schematic diagram of a power conversion apparatus using a double-sided cooling structure for the wiring structure in FIG. 4.

In the wiring structure 1B of the power conversion apparatus shown in FIG. 7, since the cooling fins 21 are arranged on both surfaces of the power conversion module 20, heat dissipation can be performed on both sides of the power conversion module 20. Accordingly, the power conversion module 20 can be efficiently heat-dissipated.

Figure 8:
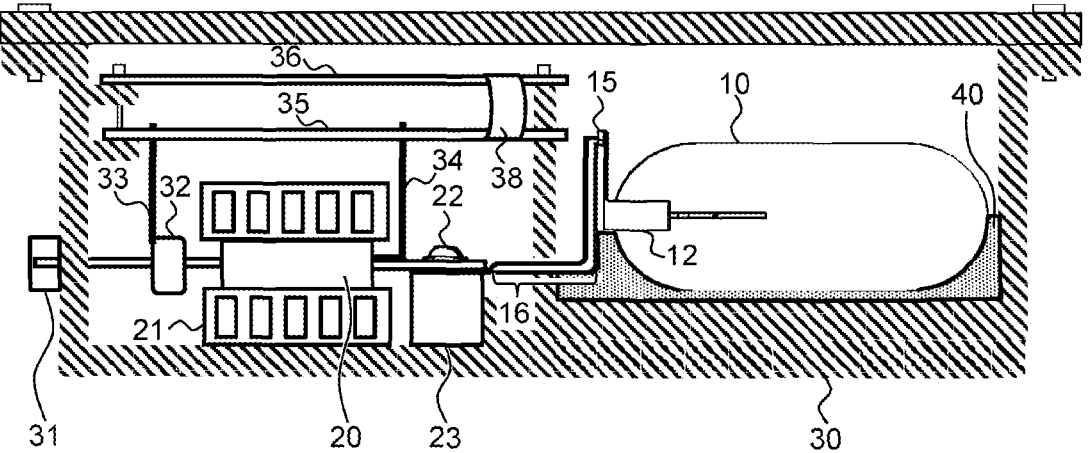
FIG. 8 is a diagram of an inverter system according to an embodiment of the present invention.

FIG. 8 is a diagram of an inverter system according to an embodiment of the present invention.

In the inverter system 60 using the wiring structure of the power conversion apparatus, the power conversion module 20 described above constitutes a three-phase inverter system 60. It should be noted that an example of the power conversion module shown in FIG. 8 is 2-in-1. In addition, a structure in which the terminals (negative electrode terminal 11 and positive electrode terminal 12) of the capacitor element 10 and the DC conductor plates (positive electrode conductor plate 14 and negative electrode conductor plate 13) are connected, and the laminated conductor portion 16 and the power conversion module 20 are screwed onto the terminal block 23 by the connecting screw 22 and connected is similar to that in FIGS. 4 and 5 described above.

A function of the power conversion apparatus will be described. The power conversion apparatus has a function of converting DC power supplied from a DC power supply into AC power to be supplied to an AC electric load such as a dynamo-electric machine, or a function of converting AC power generated by the dynamo-electric machine into DC power to be supplied to the DC power supply. In order to achieve this conversion function, the power conversion apparatus includes a power conversion module 20 having a power semiconductor element, and the power conversion module 20 performs power conversion from DC power to AC power or from AC power to DC power by the power semiconductor element repeating conduction operation and cutoff operation.

The current is repeatedly cut off and conducted by the switching operation of the power semiconductor element, and at this time, a spike voltage is generated by the inductance present in the circuit portion of the power conversion apparatus. When the spike voltage increases, the voltage may exceed the rated voltage of the power semiconductor element. In order to reduce the spike voltage, the smoothing capacitor 10 is provided, and the parasitic inductance of the DC electric wiring provided between the capacitor 10 and the power conversion module 20 is reduced by the present invention.

A configuration of the power conversion apparatus will be described. The power conversion module 20 is connected to a control board 35 through a control signal terminal 34. During operation of the inverter system 60, the control board 35 controls the power conversion module 20, a current flows from the capacitor element 10 to the power conversion module 20 through the laminated conductor portion 16, and the current is output to the power output terminal 31.

A current value output to the power output terminal 31 is detected by a current sensor 32, and a current detection signal is transmitted to the control board 35 through a current sensor signal terminal 33. The current detection signal is transmitted to the host control board 36 through the transmission path 38, and the host control board 36 generates a control signal of the power conversion module 20 based on the transmitted current detection signal. The generated control signal is transmitted to the power conversion module 20 through the control signal terminal 34.

During operation of the inverter system 60, the capacitor element 10, the laminated conductor portion 16, and the power conversion module 20 in the path through which the current flows generate heat. The capacitor element 10 is thermally connected to a casing 30 of the inverter system by a capacitor fixing resin 40. The capacitor element 10 is cooled by the casing 30 through the capacitor fixing resin 40. In addition, the power conversion module 20 is directly cooled through the cooling heat dissipation fin 21, and is housed in a casing of the power conversion apparatus.

According to an embodiment of the present invention described above, the following action and effect are produced.

(1) A power conversion apparatus includes: a positive electrode terminal 12 and a negative electrode terminal 11 being terminals of a capacitor element 10; a positive electrode conductor plate 14 connected to the positive electrode terminal 12; a negative electrode conductor plate 13 connected to the negative electrode terminal 11; and a power conversion module 20 connected to the positive electrode conductor plate 14 and the negative electrode conductor plate 13, the power conversion module 20 configured to convert DC power and AC power into each other. The positive electrode terminal 12 and the negative electrode terminal 11 are formed along an arrangement direction of the capacitor element 10. The positive electrode conductor plate 14 and the negative electrode conductor plate 13 form a laminated conductor portion 16 in which the positive electrode conductor plate 14 and the negative electrode conductor plate 13 have respective main surfaces disposed, to face the main surface of the capacitor element 10, and are laminated to each other. The laminated conductor portion 16 has a first laminated region 17 laminated to face a main surface of the negative electrode terminal 11 and a second laminated region 18 laminated to face a main surface of the positive electrode terminal 12. With this configuration, it is possible to provide a power conversion apparatus that achieves both miniaturization and low inductance.

(2) The tip of the positive electrode terminal 12 is connected to the end portion 2 of the second laminated region 18, and the tip of the negative electrode terminal 11 is connected to the end portion 2 of the first laminated region 17. With this configuration, there is no need to provide a penetrating portion in the bus bar portion for connection, and the insulation treatment can be facilitated.

(3) An end portion 2 of the first laminated region 17 and an end portion 2 of the second laminated region 18 are respectively connected to a tip of the negative electrode terminal 11 and a tip of the positive electrode terminal 12 by TIG welding, laser welding, or a screw terminal. With this configuration, connection in the manufacturing step can be simplified.

(4) In the laminated conductor portion 16, an end portion 3 on a side opposite to a side where an end portion 2 of the first laminated region 17 and an end portion 2 of the second laminated region 18 are provided is connected to the power conversion module 20. With this configuration, it is possible to contribute to miniaturization of the power conversion apparatus by the wiring structure to which the present invention is applied.

(5) The power conversion module 20 is housed in a housing casing 30 through a cooling fin 21, and the capacitor element 10 is housed in the housing casing 30 through a capacitor fixing resin 40 being an adhesive resin. With this configuration, the cooling effect of the power conversion module 20 can be enhanced.

(6) Neither the positive electrode conductor plate 14 nor the negative electrode conductor plate 13 has a penetrating portion for passing the positive electrode terminal 12 or the negative electrode terminal 11. With this configuration, the insulation treatment in the manufacturing step is not complicated.

Although described above, deletion, replacement with another configuration, and addition of another configuration can be performed within a scope not departing from the technical idea of the invention, and an aspect thereof is also included in the scope of the present invention. Furthermore, a configuration in which the above-described embodiment and a plurality of modifications are combined may be used.

REFERENCE SIGNS LIST

1 wiring structure of power conversion apparatus
2 end portion of bus bar portion (capacitor side)

3 end portion of bus bar portion (power conversion module side)

4 bus bar portion

5 insulation cap

10 capacitor element

11 negative electrode terminal of capacitor element

12 positive electrode terminal of capacitor element

13 negative electrode conductor plate

14 positive electrode conductor plate

15 connecting portion of end portion

16 laminated conductor portion

17 first laminated region

18 second laminated region

19 exposed core

20 power conversion module

21 cooling (heat dissipation) fin

22 screw

23 terminal block

30 casing

31 power output terminal

32 current sensor

33 current sensor signal terminal

34 control signal terminal

35 control board

36 host control board

38 transmission path

40 capacitor fixing resin

60 inverter system

The invention claimed is:

1. A power conversion apparatus comprising:
a positive electrode terminal and a negative electrode terminal being terminals of a capacitor element;
a positive electrode conductor plate connected to the positive electrode terminal;
a negative electrode conductor plate connected to the negative electrode terminal; and
a power conversion module connected to the positive electrode conductor plate and the negative electrode conductor plate, the power conversion module configured to convert DC power and AC power into each other,
wherein the positive electrode terminal and the negative electrode terminal are formed along an arrangement direction of the capacitor element,
the positive electrode conductor plate and the negative electrode conductor plate form a laminated conductor portion in which the positive electrode conductor plate and the negative electrode conductor plate have respective main surfaces disposed, to face the main surface of the capacitor element, and are laminated to each other, and
the laminated conductor portion has a first laminated region laminated to face a main surface of the negative electrode terminal and a second laminated region laminated to face a main surface of the positive electrode terminal.

2. The power conversion apparatus according to claim 1, wherein a tip of the negative electrode terminal is connected to an end portion of the first laminated region.

3. The power conversion apparatus according to claim 2, wherein a tip of the positive electrode terminal is connected to an end portion of the second laminated region.

4. The power conversion apparatus according to claim 3, wherein an end portion of the first laminated region and an end portion of the second laminated region are respectively connected to a tip of the negative electrode terminal and a tip of the positive electrode terminal by TIG welding.

5. The power conversion apparatus according to claim 3, wherein an end portion of the first laminated region and an end portion of the second laminated region are respectively connected to a tip of the negative electrode terminal and a tip of the positive electrode terminal by laser welding.

6. The power conversion apparatus according to claim 3, wherein an end portion of the first laminated region and an end portion of the second laminated region are respectively connected to a tip of the negative electrode terminal and a tip of the positive electrode terminal by a screw terminal.

7. The power conversion apparatus according to claim 3, wherein in the laminated conductor portion, an end portion on a side opposite to a side where an end portion of the first laminated region and an end portion of the second laminated region are provided is connected to the power conversion module.

8. The power conversion apparatus according to claim 7, wherein
the power conversion module is housed in a housing casing through a cooling fin, and
the capacitor element is housed in the housing casing through an adhesive resin.

9. The power conversion apparatus according to claim 1, wherein neither the positive electrode conductor plate nor the negative electrode conductor plate has a penetrating portion for passing the positive electrode terminal or the negative electrode terminal.

10. A power conversion apparatus comprising:
a positive electrode terminal and a negative electrode terminal being terminals of a capacitor element;
a positive electrode conductor plate connected to the positive electrode terminal;
a negative electrode conductor plate connected to the negative electrode terminal; and
a power conversion module connected to the positive electrode conductor plate and the negative electrode conductor plate, the power conversion module configured to convert DC power and AC power into each other, wherein
the positive electrode terminal and the negative electrode terminal are formed along an arrangement direction of the capacitor element,
the positive electrode conductor plate and the negative electrode conductor plate form a laminated conductor portion in which the positive electrode conductor plate and the negative electrode conductor plate have respective main surfaces disposed, to face the main surface of the capacitor element, and are laminated to each other,
the laminated conductor portion has a first laminated region laminated to face a main surface of the negative electrode terminal and a second laminated region laminated to face a main surface of the positive electrode terminal,
a tip of the negative electrode terminal is connected to an end portion of the first laminated region,
a tip of the positive electrode terminal is connected to an end portion of the second laminated region, and
an end portion of the first laminated region and an end portion of the second laminated region are respectively connected to a tip of the negative electrode terminal and a tip of the positive electrode terminal by TIG welding.

11. The power conversion apparatus according to claim 10, wherein an end portion of the first laminated region and an end portion of the second laminated region are respectively connected to a tip of the negative electrode terminal and a tip of the positive electrode terminal by laser welding.

12. The power conversion apparatus according to claim 10, wherein an end portion of the first laminated region and an end portion of the second laminated region are respectively connected to a tip of the negative electrode terminal and a tip of the positive electrode terminal by a screw terminal.

13. The power conversion apparatus according to claim 10, wherein in the laminated conductor portion, an end portion on a side opposite to a side where an end portion of the first laminated region and an end portion of the second laminated region are provided is connected to the power conversion module.

14. The power conversion apparatus according to claim 13, wherein the power conversion module is housed in a housing casing through a cooling fin, and the capacitor element is housed in the housing casing through an adhesive resin.

15. The power conversion apparatus according to claim 10, wherein neither the positive electrode conductor plate nor the negative electrode conductor plate has a penetrating portion for passing the positive electrode terminal or the negative electrode terminal.

\* \* \* \* \*